United States Patent
Kuhn et al.

(10) Patent No.: US 7,999,607 B2
(45) Date of Patent: *Aug. 16, 2011

(54) POWER SWITCHES HAVING POSITIVE-CHANNEL HIGH DIELECTRIC CONSTANT INSULATED GATE FIELD EFFECT TRANSISTORS

(75) Inventors: Kelin J. Kuhn, Aloha, OR (US); Richard K. Hose, Jr., Hillsboro, OR (US); Edward Burton, Hillsboro, OR (US); Rajesh Kumar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/775,209

(22) Filed: May 6, 2010

(65) Prior Publication Data
US 2010/0214005 A1 Aug. 26, 2010

Related U.S. Application Data

(63) Continuation of application No. 11/394,810, filed on Mar. 31, 2006, now Pat. No. 7,737,770.

(51) Int. Cl.
*G05F 1/10* (2006.01)
*G05F 3/02* (2006.01)

(52) U.S. Cl. .................................................. 327/544
(58) Field of Classification Search .................. 327/544; 257/675; 716/8
See application file for complete search history.

(56) References Cited

U.S. PATENT DOCUMENTS

| | | | |
|---|---|---|---|
| 6,570,439 B2 * | 5/2003 | Berthold | 327/544 |
| 6,620,713 B2 | 9/2003 | Arghavani et al. | |
| 6,709,911 B1 | 3/2004 | Doczy et al. | |
| 6,716,707 B1 * | 4/2004 | Brask et al. | 438/287 |
| 7,084,038 B2 | 8/2006 | Doczy et al. | |
| 2006/0060930 A1 | 3/2006 | Metz et al. | |
| 2006/0079005 A1 | 4/2006 | Brask et al. | |
| 2006/0121678 A1 | 6/2006 | Brask et al. | |
| 2006/0121742 A1 | 6/2006 | Metz et al. | |
| 2006/0170461 A1 | 8/2006 | Bhattacharya et al. | |
| 2006/0220090 A1 | 10/2006 | Metz et al. | |
| 2006/0278941 A1 | 12/2006 | Metz et al. | |
| 2006/0279267 A1 * | 12/2006 | Burton et al. | 323/282 |
| 2007/0023878 A1 | 2/2007 | Burton | |

* cited by examiner

*Primary Examiner* — Lincoln Donovan
*Assistant Examiner* — John W Poos
(74) *Attorney, Agent, or Firm* — Blakely, Sokoloff, Taylor & Zafman LLP

(57) ABSTRACT

Power switch units for microelectronic devices are disclosed. In one aspect, a microelectronic device may include a functional circuit, and a power switch unit to switch power to the functional circuit on and off. The power switch unit may include a large number of transistors coupled together. The transistors may include predominantly positive-channel, insulated gate field effect transistors, which have a gate dielectric that includes a high dielectric constant material. Power switch units having such transistors may tend to have low power consumption. In an aspect, an overdrive voltage may be applied to the gates of such transistors to further reduce power consumption. Methods of overdriving such transistors and systems including such power switch units are also disclosed.

15 Claims, 13 Drawing Sheets

POWER SWITCHES HAVING POSITIVE-CHANNEL HIGH DIELECTRIC CONSTANT INSULATED GATE FIELD EFFECT TRANSISTORS

The present application is a continuation of U.S. patent application Ser. No. 11/394.810, tiled on Mar. 31, 2006, now U.S. Pat. No. 7,737,770 entitled "Power Switches Having Positive-Channel High Dielectric Constant Insulated Gate Field Effect Transistors". U.S. patent application Ser. No. 11/394,810 is incorporated herein by reference.

BACKGROUND

1. Field

Embodiments of the invention relate to microelectronic devices. In particular, embodiments of the invention relate to power switches for microelectronic devices.

2. Background Information

In electronic devices it may be desirable to reduce the amount of power that is consumed by a microelectronic device. For example, in battery powered electronic devices it may be desirable to reduce the amount of power consumed by the microelectronic device in order to extend the time the device may be powered by the battery.

A power switch may be included in a microelectronic device in order to switch power on and off to a circuit portion of the microelectronic device. For example, the power switch may switch power off to the circuit portion when the circuit portion and/or the device is relatively idle.

Now, the power switches may also tend to consume some electrical power. It is generally desirable to reduce the amount of power consumed by the power switches to help avoid negating or cancelling power savings due to switching power off to the circuit portion of the microelectronic device.

BRIEF DESCRIPTION OF THE SEVERAL VIEWS OF THE DRAWINGS

The invention may best be understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Figure 1:
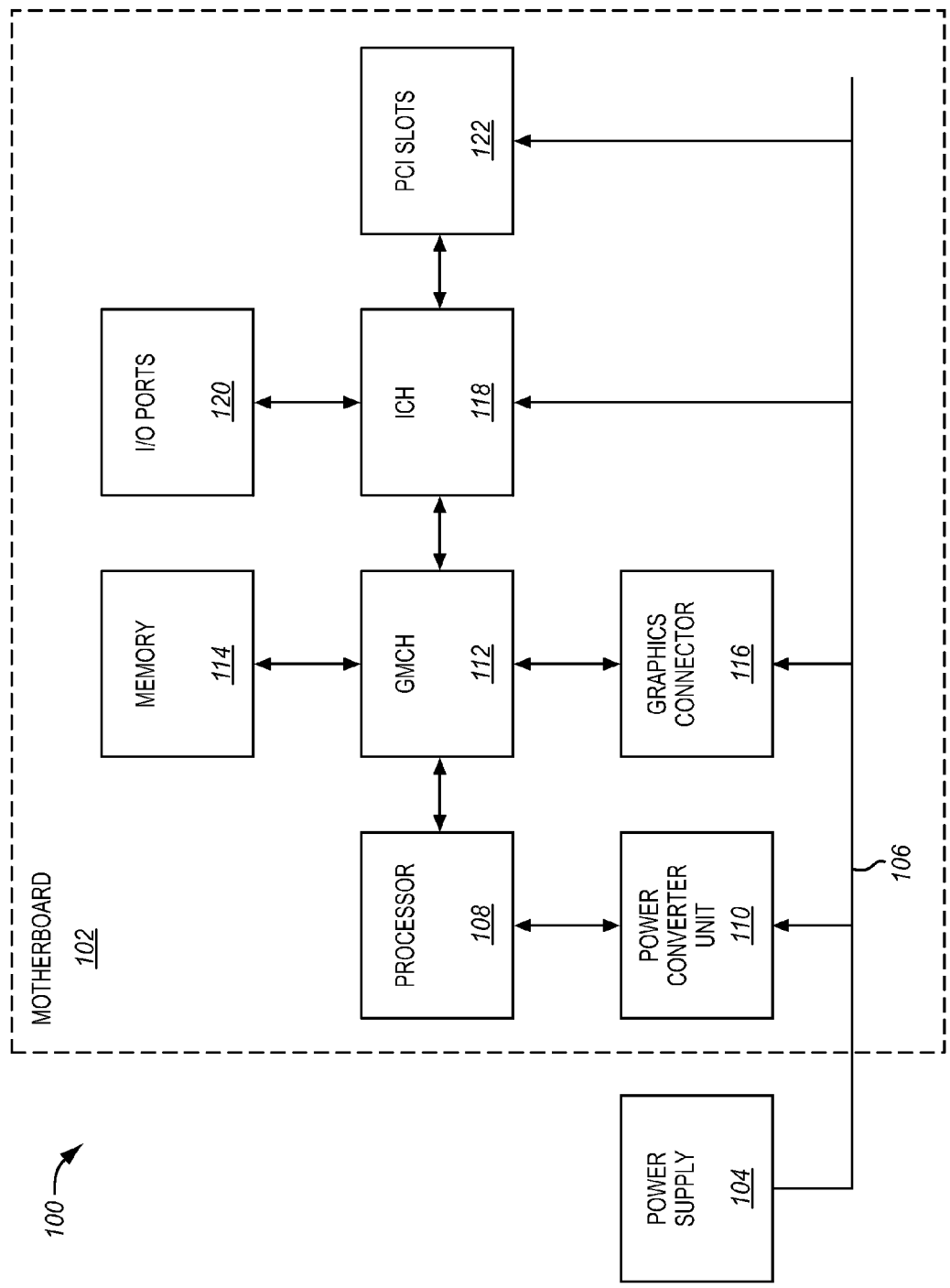
FIG. 1 is a simplified block diagram of an exemplary microprocessor-based computer system, according to one or more embodiments of the invention.

FIG. 1 is a simplified block diagram of an exemplary microprocessor-based computer system 100, according to one or more embodiments of the invention. The computer system may include, but is not limited to, a portable computer, laptop computer, desktop computer, server, or mainframe computer, to name just a few examples. The computer system represents one possible computer system in which one or more embodiments of the invention may be implemented, however other computer systems and variations of the computer system are also contemplated. Additionally, it is to be appreciated that embodiments of the invention may be implemented in other electronic devices, such as, for example, cellular telephones, personal digital assistants, digital televisions, and the like.

The computer system includes a motherboard 102 and a power supply 104. The power supply may transform alternating current (AC) input from a wall outlet or other primary supply to one or more direct current (DC) voltages that may be distributed to the motherboard and components coupled therewith on a power bus 106.

The motherboard may provide the core processing and interface components of the computer system. The motherboard includes a processor 108 (sometimes referred to as a Central Processing Units (CPU)), a power converter unit 110, a graphics/memory controller hub (GMCH) 112, memory 114, a graphics connector 116, an input/output (I/O) controller hub (ICH) 118, I/O ports 120, and Peripheral Component Interconnect bus (PCI) slots 122. In one aspect, the PCI slots may adhere to the PCI Local Bus Specification Revision 2.1, or a related specification, developed by the PCI Special Interest Group of Portland, Oreg. As shown the components may be coupled with one another through various buses. Other components may optionally be included. It should be appreciated that numerous variations in the number of components, and in the coupling of the components within the computer system, are possible and are contemplated.

The GMCH may include a memory controller that may couple the memory with the processor. The memory may include system or main memory that may store data and program instructions that may be executed by the processor. The system memory may include a random access memory (RAM) or other dynamic storage device. Different types of RAM memory that are included in some, but not all computer systems, include, but are not limited to, static-RAM (SRAM) and dynamic-RAM (DRAM). The memory may also optionally include read only memory (ROM) to store static information and instructions for the processor, such as, for example, the basic input-output system (BIOS). Different types of memory that are included in some, but not all, computer systems include Flash memory, programmable ROM (PROM), erasable-and-programmable ROM (EPROM), and electrically-erasable-and-programmable ROM (EEPROM). Alternatively, other types of memory may optionally be used. The GMCH may also include a high-speed video/graphics interface such as the Accelerated Graphics Port (AGP), which may adhere to the AGP V3.0 Interface Specification Revision: 1.0, or a related specification, developed by Intel Corporation of Santa Clara, Calif., or the PCI Express™ interface, which may adhere to the PCI Express Base Specification 1.1, or a related specification, developed by the PCI Special Interest Group of Portland, Oreg.

The ICH is coupled with the GMCH and may provide an interface to various I/O devices associated with the computer system. The ICH may be coupled with one or more I/O ports. Suitable I/O ports include, but are not limited to, RS-232 serial ports, parallel ports, and Universal Serial Bus (USB) ports, and combinations thereof. USB ports may be specified by the Universal Serial Bus Revision 1.1 specification or the Universal Serial Bus Revision 2.0 specification, for example, both from the USB Implementers Forum, Inc. of Portland, Oreg. The ICH may be coupled with one or more of the PCI slots. The ICH may provide a bridge from the processor to peripheral equipment and peripheral cards (not illustrated) that may be connected to one or more of the 110 ports or plugged into one or more of the PCI slots.

The processor may perform much of the processing load for the computer system. In one or more embodiments, the processor may be from the Intel® family of processors, such as, for example, the Pentium® II, Pentium® III, Pentium® IV, Pentium® 4 Processor-M, and Itanium processors, available from Intel Corporation of Santa Clara, Calif. Alternatively, other processors may optionally be used. In various embodiments of the invention, a processor may have a single core or may be a "multicore" processor having two or more processing units. The two or more processing units or cores may be implemented on a single die or on multiple die. The processor may or may not have on-die memory, as cache memory may also optionally be located off-die. In an alternate embodiment, the computer system may include multiple processors.

The computer system includes the power converter unit coupled with the power bus to receive DC power from the power bus. To accommodate the needs of various processors, the power converter unit, which may also be referred to as a DC-to-DC converter or voltage regulator, may convert one or more of the voltages from the power bus to the one or more DC voltages used by the particular processor. The DC voltages used by the processor may depend upon the particular technology, speed, and other characteristics of the processing core or cores. The power converter unit may be located near the package of the processor and the DC voltage may be provided through pins, leads, lands, or bumps on the microelectronic device package, or through other conductive mediums.

The processor or portions thereof may operate at different power levels. For example, a microprocessor in a computer system running a word processing application may only operate for a few milliseconds each time a key on the keyboard is struck, which by way of example may be less than about once every 100 milliseconds. This may represent a duty cycle of several percent, or less. In such cases, significant power may be saved by switching power off, or at least reducing power to, circuits or other portions of the processor that are idle, or not in use, or that do not require full power. There is not requirement that the entire processor be fully powered at all times. Portions of the processor may be powered down, or at least put into a reduced power state. In the case of a "multicore" processor, there is an opportunity to reduce operating power during relatively idle or low processing duty periods on one or more of the processing cores. Conserving power may be advantageous in battery-powered devices, such as, for example, laptop computers.

Figure 2:
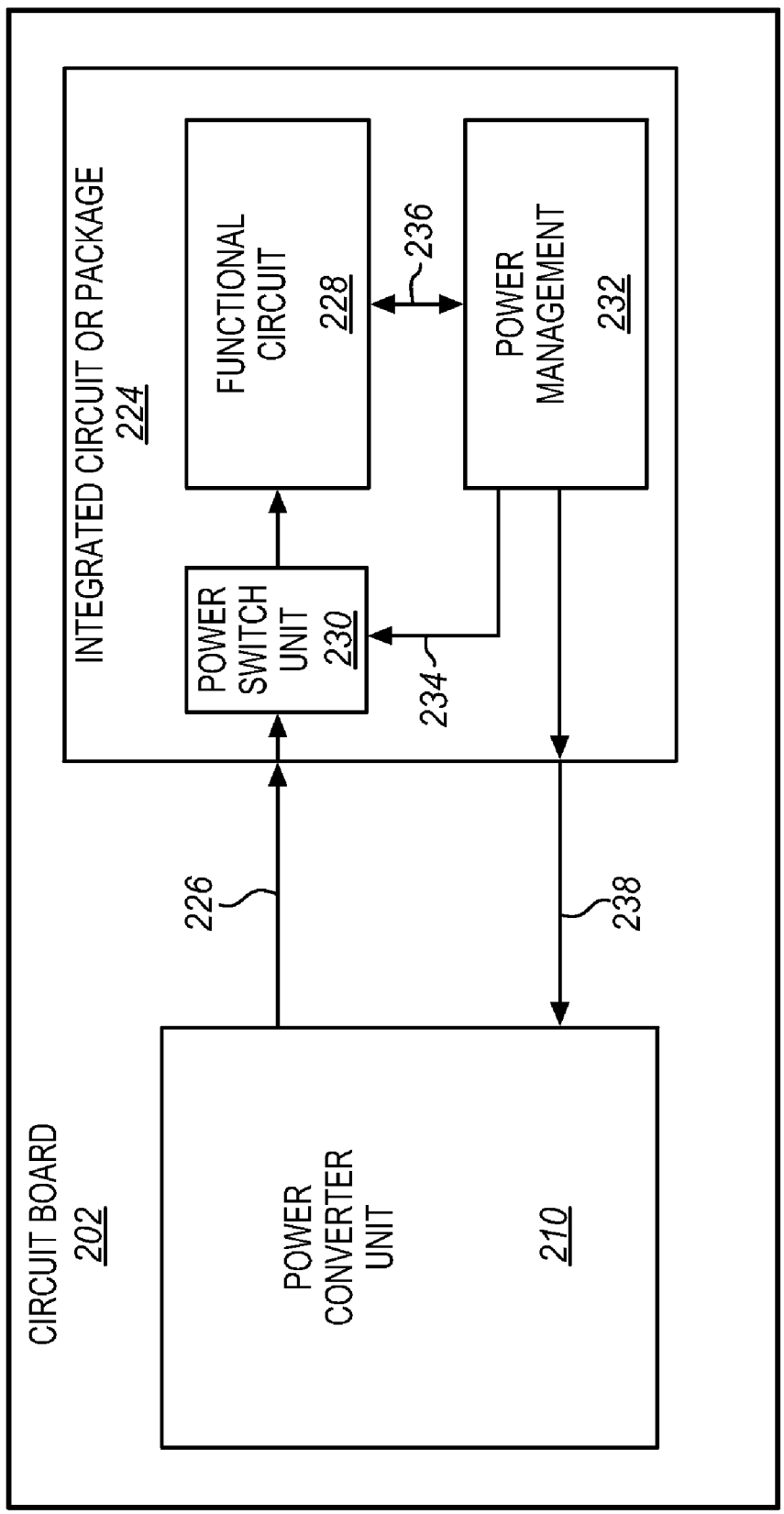
FIG. 2 is a block diagram of a power converter unit and a microelectronic device or package thereof, according to one or more embodiments of the invention.

FIG. 2 is a block diagram of a power converter unit 210 and a microelectronic device or package thereof 224, according to one or more embodiments of the invention. The power converter unit and the microelectronic device or package thereof are each coupled with one another through a circuit board 202, such as, for example, a motherboard.

The power converter unit is electrically coupled with the microelectronic device through the circuit board and may provide one or more supply voltages 226 to the microelectronic device through the circuit board. Conventional power converter units employed in computer systems and other electronic devices are suitable. By way of example, and not limitation, the power converter unit may include discrete components mounted on the circuit board external to the microelectronic device.

For simplicity, the microelectronic device or package thereof will be referred to simply as a "microelectronic device" in the discussion below. In one or more embodiments of the invention, the microelectronic device may be included in a package that is coupled with the circuit board, although the scope of the invention is not limited in this respect. As another option, the microelectronic device may be directly coupled with the circuit board.

In one or more embodiments of the invention, the microelectronic device includes a processor, although the scope of the invention is not limited in this respect. Other types of microelectronic devices known in the arts are also suitable.

The microelectronic device includes a functional circuit 228, a power switch unit 230, and a power management unit 232. The functional circuit, the power switch unit, and the power management unit may each include hardware, such as, for example, circuitry, or software, such as, for example, sequences of instructions, or a combination of hardware and software. In one or more embodiments of the invention, each of the functional circuit, the power switch unit, and the power management unit may include microelectronic circuitry. In one or more embodiments of the invention, the microelectronic circuitries of the three units may be monolithically integrated on a single monolithic microelectronic device or die, although this is not required.

The power switch unit may also be referred to herein as a power gate unit. The power switch unit may receive the one or more supply voltages from the power converter unit. The power switch unit may also receive one or more power switching control signals 234. In the illustrated embodiment, the power switch unit is shown to receive the one or more power gating or switching control signals from the power management unit, although the scope of the invention is not limited in this respect. In alternate embodiments, the control signals may optionally be received from another component, such as, for example, another microelectronic device, an operating system or other application, or the like.

The one or more supply voltages destined for the functional circuit may first be provided to the input of the power switch unit. The power switch unit may switch or gate voltage to the functional circuit based, at least in part, on the one or more received power switch control signals. In one or more embodiments of the invention, the power switch unit may switchably increase and decrease the voltage to the functional circuit in dependence upon the one or more received control signals. For example, in one or more embodiments of the invention, power switch unit may switch voltage so that power consumed by the functional circuit is switched on and off. It is to be appreciated that "off" need not imply that absolutely no power is consumed to the functional unit, since there may be some leakage, but rather that a lower level of power associated with an off operational state is consumed. When the power switch unit is switched on, the received one or more supply voltages, less some loss due to resistance of the power switch unit, may be provided from an output of the power switch unit to the functional circuit. Alternatively, when the power switch unit is switched off, the power switch unit may block at least a significant portion of the received one or more supply voltages or power from being communicated to the functional circuit. Power may thereby be conserved. The power switch unit will be discussed in further detail below.

The functional circuit may include one or more circuits of the microelectronic device that may be turned on or off, or otherwise placed into multiple different power states. Examples of suitable functional circuits include, but are not limited to, one or more cores of a multicore processor or other type of microelectronic device, one or more execution units, such as, for example, one or more multipliers and/or one or more adders, one or more storage locations, such as, for example, one or more lines of a cache memory, and combinations thereof, to name just a few examples. Alternatively, the functional circuit may include other circuits or other portions of the microelectronic device, such as, for example, input-output (I/O) circuits, combinational logic, etc.

The microelectronic device may also include the aforementioned power management unit. As shown, in one or more embodiments of the invention, the power management unit may optionally sense or otherwise determine processing status 236 of the functional circuit. By way of example, the processing status may indicate a processing load of the functional circuit, how busy the functional circuit is, the total processing load of the microelectronic device, or the like. Power management may also, or alternatively, be based on other factors, such as, for example, whether or not battery power is being used, how much battery power is available, temperature of the functional circuit, or the like, or other factors relevant to power management. The scope of the invention is not limited in this respect. In some instances, the power management unit may determine whether or not to modify the voltage that is provided to the functional circuit, and may then correspondingly signal the power converter unit when the voltage is to be modified. For example, the power management unit may control the power converter unit to keep a supply voltage substantially constant in order to suppress a load-dependent voltage drop. In some cases the power management unit may compare a status processing load with a threshold processing load and determine to modify the voltage to reduce a power consumption level when the status processing load is less than the threshold processing load, although the scope of the invention is not limited in this respect.

The power management unit is in communication with the power converter unit. As shown, in one or more embodiments of the invention, the power management unit may provide power converter unit control information 238 to the power converter unit to control the power converter unit to set one or more parameters, such as, for example, one or more levels of the one or more voltages provided to the microelectronic device. The power converter unit control information may include analog and/or digital signals, for example.

The power management unit is also in communication with the power switch unit. As shown, in one or more embodiments of the invention, the power management unit may provide the aforementioned power switch control information to the power switch unit. In one or more embodiments of the invention, the power switch control information may include information to change a state of the power switch unit, such as, for example, information to turn the power switch unit on or off. When the power switch unit is switched on, power may be communicated or provided to the functional circuit through the power switch unit to allow the functional circuit to operate. Alternatively, when the power switch unit is switched off, power to the functional circuit may be turned off, or at least significantly reduced. As discussed above, "off" need not imply that no power whatsoever is provided to the functional unit, but rather just a lower power associated with an off operational state.

A single functional circuit and power switching circuit have been shown and described, although the scope of the invention is not limited in this respect. In one or more embodiments of the invention, multiple dedicated power switch units may be included and used to switch power to multiple corresponding functional circuits. For example, in one or more embodiments of the invention, each core of a multicore processor may have a separate dedicated power switch unit to allow power to each of the cores to be controlled separately of the others.

Power switch units will now be discussed in greater detail. In one or more embodiments of the invention, a power switch may include a large number of transistors coupled together, such as, for example, coupled substantially in parallel. It is not required that all of the transistors are coupled in parallel. For clarity, as used herein, the phrase "a large number of transistors coupled in parallel" encompasses configurations having transistors coupled in series and/or series-parallel configurations as long as a large number of transistors are coupled in parallel. Transistors coupled together in parallel may be switched on and off substantially in unison, at least in concept, like a single large transistor, and may be capable of carrying a large current with a low resistance.

Figure 3:
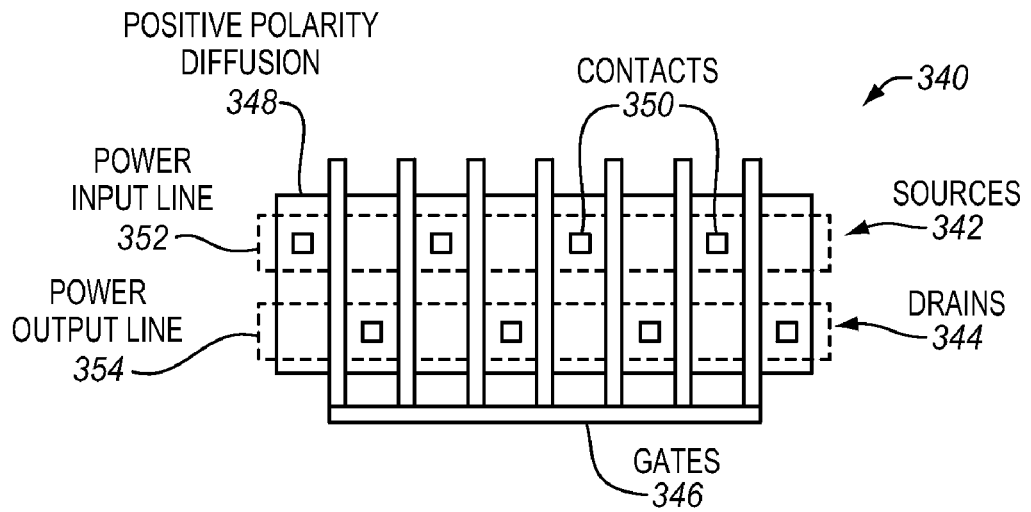
FIG. 3 shows an example of a leaf cell design that may be used for a power switch unit, according to one or more embodiments of the invention.

FIG. 3 shows an example of a leaf cell design 340 that may be used for a power switch unit, according to one or more embodiments of the invention. The particular illustrated leaf cell design includes seven transistors coupled in parallel with one another. The sources 342, drains 344, and gates 346 of the transistors are illustrated. In the illustrated embodiment, the sources and drains are formed in a positive polarity diffusion region 348.

Contacts 350 may be used to couple the transistors with a power source and destination. In particular, as viewed, the uppermost contacts of the sources may be coupled with a power input line 352, the location of which is shown in dashed lines, and the lowermost contacts of the drains may be coupled with a power output line 354, the location of which is shown in dashed lines. Power may be provided to the power switch unit on the power input line, such as, for example, from the power converter unit, and gated or switched power may, if the power switch unit is switched on, be provided from the power switch unit to a destination, such as, for example, a functional circuit, on the power output line.

Figure 4:
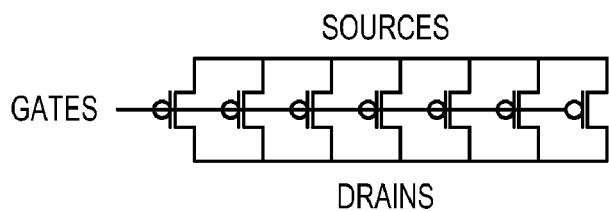
FIG. 4 shows a circuit representation of the leaf cell design of FIG. 3.
Figure 5:
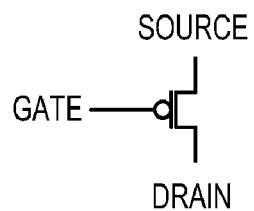
FIG. 5 shows a further circuit representation of the leaf cell design of FIG. 3.

FIG. 4 shows a circuit representation of the leaf cell design and shows that the seven transistors are coupled in parallel with one another. FIG. 5 shows a further circuit representation and shows that the seven transistors coupled in parallel may behave like a single transistor.

Figure 6:
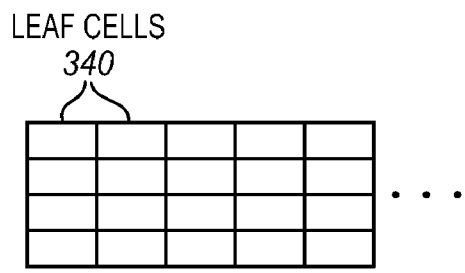
FIG. 6 shows multiple leaf cells coupled with one another so that the transistors of the leaf cells are coupled in parallel with one another, according to one or more embodiments of the invention.

FIG. 6 shows multiple leaf cells 340 coupled with one another so that the transistors of the leaf cells are coupled in parallel with one another, according to one or more embodiments of the invention. In alternate embodiments of the inventions, the leaf cells may optionally be coupled so that some of the transistors are in series. As indicated, additional leaf cells may optionally be included to form a power switch unit with a desired number of transistors.

It is to be appreciated that the scope of the invention is not limited to the particular leaf cell design illustrated. The illustrated leaf cell design is only one example of various suitable leaf cell designs that are contemplated. For example, other contemplated leaf cell designs have different numbers and arrangements of transistors.

Using such leaf cells, or entirely different leaf cells, power switch units having a large number of transistors may be constructed. As used herein, the phrase "a large number of transistors" means at least 100 transistors. Often the large number of transistors may include at least 1,000 transistors, and sometimes more, although the scope of the invention is not limited in this respect. The number of transistors that is appropriate for a particular implementation may depend in part upon such factors as the expected amount of electrical current, the tolerable amount of resistance in the power switch unit, and the strength or width of the transistors. The width of the transistors may depend in part on the fabrication process and may vary from one implementation to another. The total transistor width of the power switch unit may be a function of load. A larger total transistor width may be appropriate for a larger load in order to allow an appropriately small voltage drop. In one aspect, enough transistors of a given width are included to keep the voltage drop in a sufficient range, such as, for example, not more than about 5 mV, or not more than about 10 mV, depending on the particular application. To further illustrate, in one or more embodiments of the invention, a power switch unit for a general-purpose processor of a computer system may include around 50,000 microns of transistor width per amp of load current. For a leg size of about 0.6 microns, there may accordingly be about 83,000 transistors per amp of load current. Continuing with this non-limiting example, for a relatively small load, such as, for example about 50 mA, there may be around 4,000 transistors.

However, the scope of the invention is not so limited. This is just one example. Using such a large transistor width may allow the power switch unit to have a low resistance and a low voltage drop even for a large current. For example, in one or more embodiments of the invention, the transistors of the power switch unit may together have a resistance of around 0.2 mΩ and may support a current of around 30 A, such as may be sufficient for a general-purpose processor of a computer system. An additional resistance, for example of about 0.6 mΩ, may be incurred by the metallization used to connect the input and output of the power switch unit. In one or more embodiments of the invention, the power gate may optionally occupy a small fraction of the total area of the processor in which it is included, such as, for example, less than about 1% of the total area, although the scope of the invention is not limited in this respect.

Now, one challenge is that the power switch unit may itself consume power. It is generally desirable to reduce the amount of power that is consumed by the power switch unit, since any power that is consumed by the power switch unit may tend to negate power that is conserved by including the power switch unit in the first place. A significant source of power consumption may be due to transistor leakage in the off state. Accordingly, in one or more embodiments of the invention, it may be advantageous to include a power switch unit that has low overall current leakage. Transistors commonly have three significant current leakage components. The three current leakage components include the leakage from the source to the drain (source-drain leakage), the leakage through the gate (gate leakage), and the junction leakage.

Insulated gate field effect transistors (FET) are a common type of transistor. CMOS (complementary metal oxide semiconductor (MOS)) logic is a common type of circuit logic that may include both negative-channel and positive-channel insulated gate FET devices. CMOS circuits may include a combination of an NMOS (negative-channel MOS) FET and a PMOS (positive-channel MOS) FET. MOS devices are unipolar devices, meaning that charge transfer is by one type of carrier. NMOS transistors may be formed with n-diffusion source and drain regions, and may have the channel formed in a p-well (p-doped diffusion region directly under the gate). PMOS transistors may be formed with p-diffusion source and drain regions, and may have the channel formed in a n-well (n-doped diffusion region directly under the gate). In NMOS transistors charge transfer occurs by the movement of electrons. In contrast, in PMOS transistors charge transfer occurs by the movement of electron vacancies. General-purpose circuits made with a CMOS process may include many combinations of NMOS and PMOS devices, including circuits with solely NMOS, solely PMOS, or some combination of the two.

Figure 7:
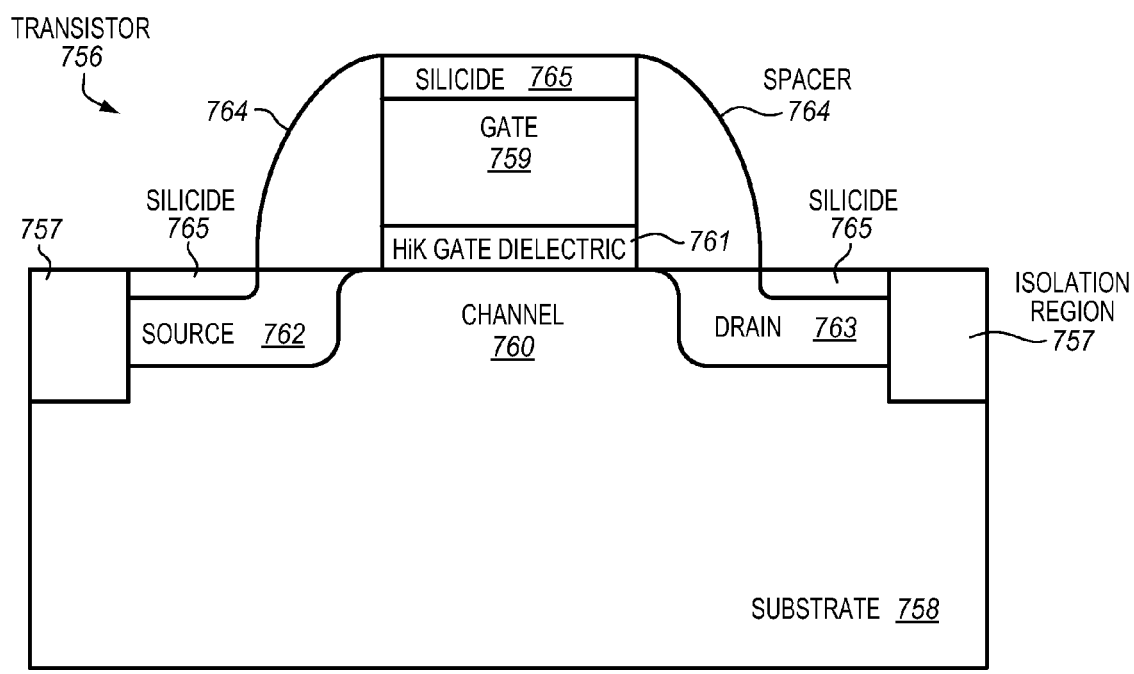
FIG. 7 shows a cross-sectional view of an exemplary transistor that may be used in a power switch unit, according to one or more embodiments of the invention.

FIG. 7 shows a cross-sectional view of an exemplary semiconductor structure or transistor 756 that may be used in a power switch unit, according to one or more embodiments of the invention. The illustrated transistor is an example of a positive-channel, insulated gate, field effect transistor (FET), having a high dielectric constant (HiK) gate dielectric 761. In particular, the transistor is a PMOS HiK FET.

Isolation regions 757, such as, for example, Shallow Junction Isolation, STI, are formed in an upper surface of a substrate 758. The transistor is formed on the upper surface of the substrate. The transistor includes a gate 759, a channel 760 beneath the gate and separated from the gate by a high dielectric constant (HiK) gate dielectric 761, a source 762 adjacent to the channel on a first side of the gate, a drain 763 adjacent to the channel on a second side of the gate.

The source, drain, and gate may optionally be similar to those in conventional PMOS FET. Optionally, in some embodiments, the source and drain may be raised. For example, the raised source and drain may optionally be fabricated from epitaxially-grown materials, such as, for example, epitaxial silicon, epitaxial doped silicon, epitaxially-grown silicon germanium (SiGe), doped epitaxially grown SiGe, or other epitaxially-grown materials. The gate may be fabricated from a variety of materials including, but not limited to, polysilicon, partially or fully silicided polysilicon, and metal gate. By way of example, the metal gate may be fabricated by replacement metal gate or subtractive metal gate methods, although the scope of the invention is not limited in this respect.

The transistor also includes spacers 764 partially over the source and drain alongside the gate. Contact regions, such as, for example, silicide surfaces 765, are included over the gate, and over the source and drain.

It is to be appreciated that the scope of the invention is not limited to the particular transistor illustrated. Other transistors known in the arts are also suitable.

As shown, a high dielectric constant (HiK) material may be used as the gate dielectric to separate the gate from the channel. As used herein, a high dielectric constant material or HiK material refers to a material that has a higher dielectric constant than silicon dioxide ($SiO_2$). As used herein, a high dielectric constant material or HiK material may refer not only to a pure HiK material, but also to stacks and other mixtures or combinations of HiK materials and other materials. For example, a stack including a layer of a HiK material and an interface oxide may be referred to as a high dielectric constant or HiK material or dielectric.

Suitable high dielectric constant (HiK) insulating materials for the gate dielectric include, but are not limited to, oxides of hafnium, such as, for example, hafnium dioxide ($HfO_2$), oxides of tantalum, such as, for example, tantalum pentoxide ($Ta_2O_5$), compounds including barium plus oxides of titanium, such as, for example barium titanate ($BaTiO_3$), compounds including barium plus oxides of zirconium, such as, for example barium zirconate ($BaZrO_3$), oxides of zirconium, such as, for example, zirconium dioxide ($ZrO_2$), oxides of aluminum, such as, for example, aluminum oxide ($Al2O_3$), oxides of yttrium, such as, for example, yttrium oxide ($Y_2O_3$), compounds including zirconium plus oxides of silicon, such as, for example zircon ($ZrSiO_4$), and other high dielectric constant insulating materials. Combinations of such materials, as well as combinations of such materials with other materials, are also suitable. In one specific embodiment of the invention, hafnium dioxide ($HfO_2$) may be used, since $HfO_2$ may in certain instances provide favorable interface layer properties, although this is not required.

In one or more embodiments of the invention, the HiK gate dielectric material may be one for which the valence band offset is sufficiently large to sufficiently suppress tunneling under regions of normal operation. For materials with large valence band offsets, the PMOS gate leakage will be one to several orders of magnitude smaller than a conventional (non-HiK) transistor and also smaller than an NMOS HiK transistor. Advantageously, this significant reduction in gate leakage may help to reduce the amount of power consumed by the power switch unit itself.

Figure 8:
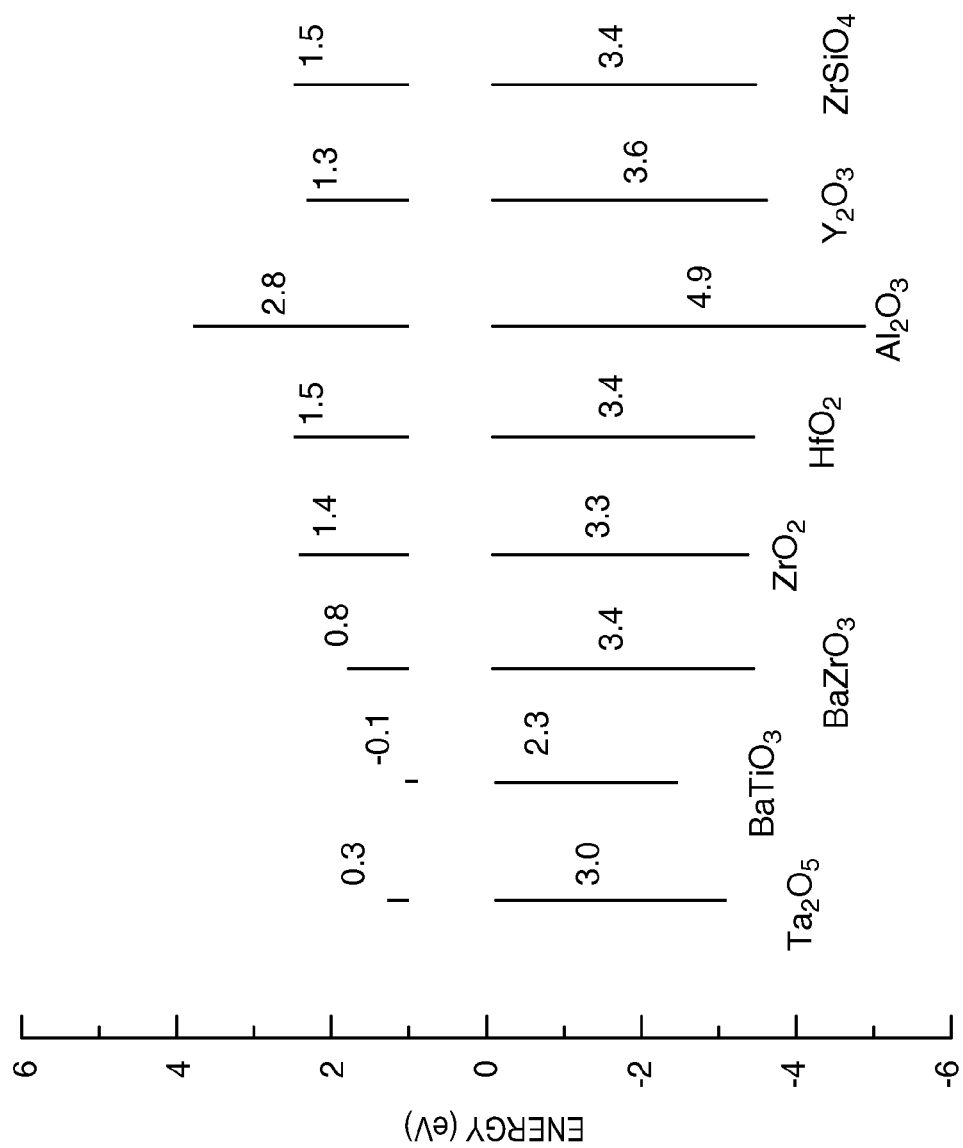
FIG. 8 is a plot showing energies of valence band offsets and conduction band offsets for various high dielectric constant materials that are suitable for a gate dielectric of a positive-channel field effect transistor, according to one or more embodiments of the invention.

FIG. 8 is a plot showing energies of valence band offsets and conduction band offsets for various high dielectric constant materials that are suitable for a gate dielectric of a positive-channel field effect transistor, according to one or more embodiments of the invention. The valance band offsets are shown on the bottom of the plot and the conduction band offsets are shown in the top of the plot. As shown, each of tantalum pentoxide ($Ta_2O_5$), barium titanate ($BaTiO_3$), barium zirconate ($BaZrO_3$), zirconium dioxide ($ZrO_2$), hafnium dioxide ($HfO_2$), aluminum oxide ($Al2O_3$), yttrium oxide ($Y_2O_3$), and zircon ($ZrSiO_4$), have a greater valence band offset than conduction band offset.

In one or more embodiments of the invention, the HiK insulating material may be formed by atomic layer deposition (ALD). Further details, if desired, of methods of forming HiK gate dielectrics, are disclosed in U.S. Pat. No. 6,620,713, entitled "INTERFACIAL LAYER FOR GATE ELECTRODE AND HIGH-K DIELECTRIC LAYER AND METHODS OF FABRICATION", filed on Jan. 2, 2002. This is just one example, and the scope of the invention is not limited to just this example.

Positive-channel FET with gates insulated by high dielectric constant materials having greater valence than conduction band offsets have relatively low gate leakage current when compared to negative-channel FETs formed from the same gate material. The valence band offset helps to suppress gate leakage. Incorporating such materials into the gate dielectric of a PMOS device offers a significantly lower gate leakage than if such materials were incorporated into the gate dielectric of an NMOS device. In one or more embodiments of the invention, due at least in part to such low current leakage, a power gate unit may include predominantly or a majority of such positive-channel, insulated gate field effect transistors, which have a high dielectric constant material as the insulator for the gate. The power switch unit may also optionally include a minority or lesser amounts of other types of transistors, such as, for example, NMOS.

Now, certain positive-channel FET, such as, for example, PMOS FET, may potentially tend to have a relatively high source-drain leakage, such as, for example, if the channels are relatively short. An approach will now be described that may optionally be employed to help further reduce source-drain leakage in such transistors.

Figure 9:
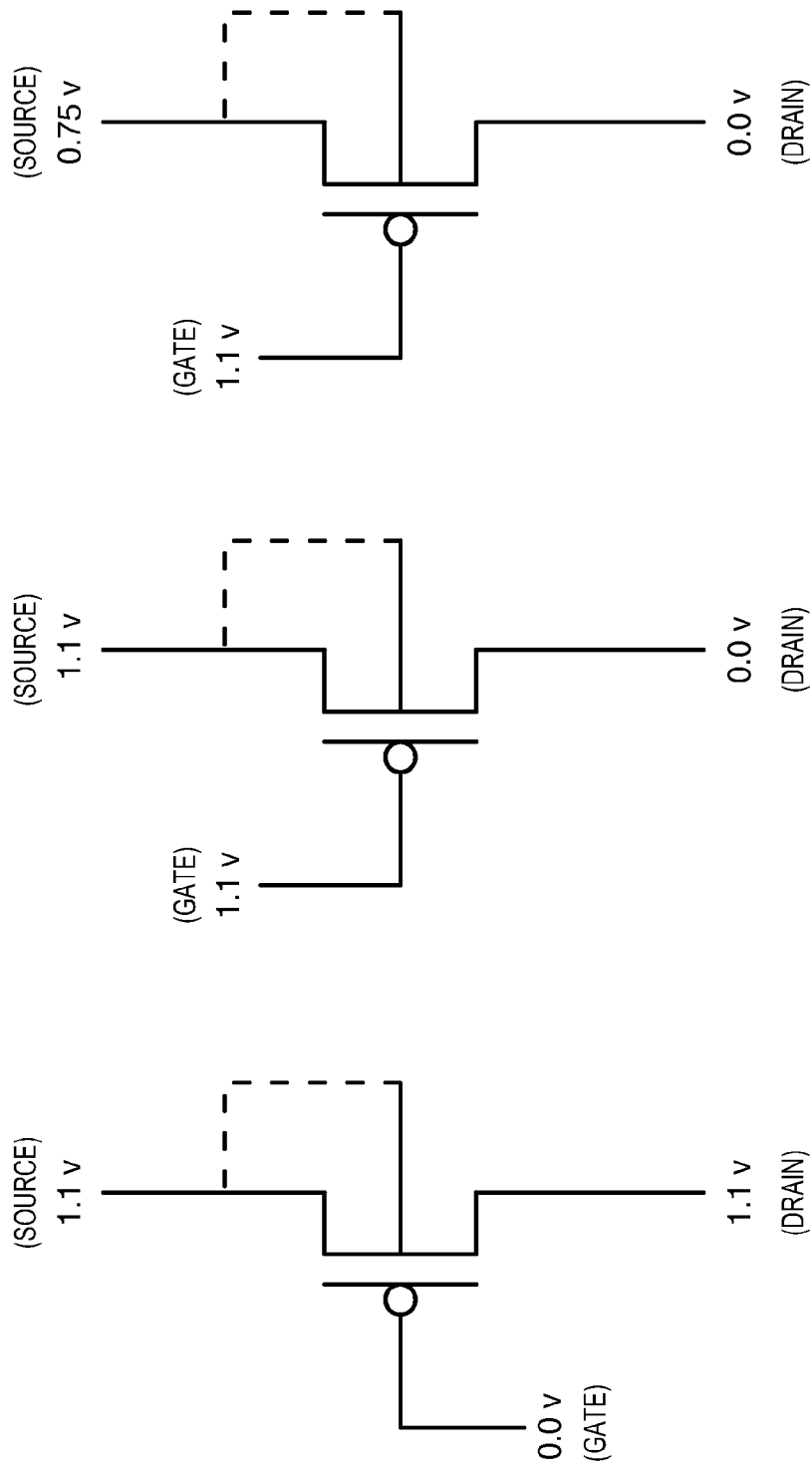
FIG. 9A shows a transistor in an active or on state, according to one or more embodiments of the invention.
FIG. 9B shows a transistor in an inactive or off state, according to one or more embodiments of the invention.
FIG. 9C shows a transistor in an inactive or off state in which the transistor is turned off by applying an overdrive voltage to the gate, according to one or more embodiments of the invention.

FIG. 9A shows a transistor in an active or on state, according to one or more embodiments of the invention. The source and the drain are both at substantially the same voltage, which in this particular case is about 1.1V, although this particular voltage is not required. The gate is at a lower voltage than the source and the drain, which in this particular case is about 0.0V, although this particular voltage is not required. Notice that the voltage of the gate is lower than the voltage of the source. In one or more embodiments of the invention, the body may be held at the same voltage as the source, but this is not required. Another option, according to one or more embodiments of the invention, is to statically or dynamically hold the body at a different voltage than the source, such as, for example, using a body bias. By way of example, the voltage may range from a forward body bias, such as, for example, of about 0.5V, to a reverse body bias, such as, for example, of about 1.1V, although this is not required. Both options are suitable, as shown by the dashed lines connecting the body with the source.

FIG. 9B shows a transistor in an inactive or off state, according to one or more embodiments of the invention. The voltage at the gate has been increased until the gate and the source are at substantially the same voltage, which in this particular case is about 1.1V, although this particular voltage is not required. A transistor is generally said to be "off" when the source and the gate are at substantially the same voltage. However, even when the source and the gate are at substantially the same voltage, there may still be some source-drain leakage. The voltage at the drain has been lowered to a lower voltage, in this particular case about 0.0V.

In one or more embodiments of the invention, in order to reduce source-drain leakage in such positive-channel FET, an overdrive voltage may be applied to the gate. That is, the relative voltages of the gate and source may be adjusted so that the transistor is even more turned off. For example, for positive-channel FET, an overdrive voltage may be applied to the gate by making the gate voltage greater than the source voltage. In other words, the voltage may be modified in the direction of turning the transistor off past the point at which the source and the gate are at substantially the same voltage FIG. 9C shows a transistor in an inactive or off state in which the transistor is turned off by applying an overdrive voltage to the gate, according to one or more embodiments of the invention. The source is at a voltage of about 0.75V, the drain is at a voltage of about 0.0V, and the gate is at a voltage of about 1.1V, although these particular voltages are not required. Notice that the voltage of the gate is higher than the voltage of the source. In particular, in the illustrated embodiment, the voltage of the gate is about 0.35V higher than the voltage of the source, although the scope of the invention is not limited in this respect. The 0.35V represents an applied overdrive voltage that may help to reduce source-drain current leakage and thereby turn the transistor off even more completely than if the voltages of the source and the gate were substantially the same. In one or more embodiments of the invention, the overdrive voltage may be applied by decreasing the voltage at the source until the voltage at the source is lower than the voltage at the gate. Such an overdrive voltage may further reduce source-drain leakage.

In one or more embodiments of the invention, two power supplies may be included in a device. In an active state, the two power supplies may initially have the same voltage, such as, for example, about 1.1V. In a power saving state, the voltage of one of the power supplies may be reduced, such as, for example, to about 0.8V, in order to provide an overdrive voltage. For example, if the gate voltage remains at about 1.1V but the source is reduced to about 0.8V in the power saving state, then this may provide about 0.3V of overdrive voltage. As previously discussed, as one example, the power converter unit may lower the voltage from 1.1V to 0.8V when instructed by the power management unit. In one or more embodiments of the invention, the adjustment of the voltage may be implemented in part by using an on-chip linear voltage regulator, although this is not required.

Now, it is not required that a 0.3V or 0.35V overdrive voltage be used. In one or more embodiments of the invention, the overdrive voltage, or the voltage of the gate minus the voltage of the source, may range from about 0.01V to the point where the gate voltage is so high that you lose the source-drain junction. For example, in various embodiments of the invention, the overdrive voltage may range from about 0.01V to about 1V, or from about 0.1V to about 0.5V, or from about 0.2V to about 0.4V, or may be about 0.35V. These are just a few illustrative examples. The scope of the invention is not limited to just these examples. Other levels of overdrive voltage may be appropriate for microelectronic devices employing different voltage levels and/or source-drain junction values and/or different body voltage values.

In one or more embodiments of the invention, the amount of overdrive voltage may be selected in order to take advantage of an available or existing off-chip voltage regulator, voltage source, or power supply, although this is not required. That is, rather than including an additional power source specifically to provide the overdrive voltage, an existing voltage may be opportunistically used to provide the overdrive, if desired. However, the scope of the invention is not limited in this respect. In one or more embodiments of the invention, a gate overdrive voltage may be generated on-chip using one or more voltage multipliers, such as, for example, those including switched capacitors.

In one particular embodiment of the invention suitable for a multicore processor, when one core is idle that core may be turned off by making the voltages at the gates and sources of the power switch substantially equal, whereas when all cores are idle all the cores may be turned off by making the voltages at the gates greater than the voltages at the sources. However, the scope of the invention is not so limited.

The valence band offset of the high dielectric constant materials may help to sufficiently suppress gate leakage even at the high gate bias due to the applied overdrive voltage so that the source-drain leakage may be reduced. Accordingly, source-drain leakage of the positive-channel high dielectric constant insulated gate field effect transistor may be reduced by applying the overdrive voltage while the gate leakage may remain sufficiently low.

Experiments indicate that a ratio of on-current leakage to off-current leakage of about 500 may be expected for a power gate unit having such transistors, even without applying a gate under-drive. For example, the on-current leakage may be about 10 A to 20 A, and the off-current leakage may be about 60 mA. Simulations suggest that significant additional leakage reductions, such as, for example, about an order of magnitude or more, may be expected when gate under-drive is applied to the power gate. However, the scope of the invention is not limited to achieving any known ratio or leakage reduction.

Figure 10:
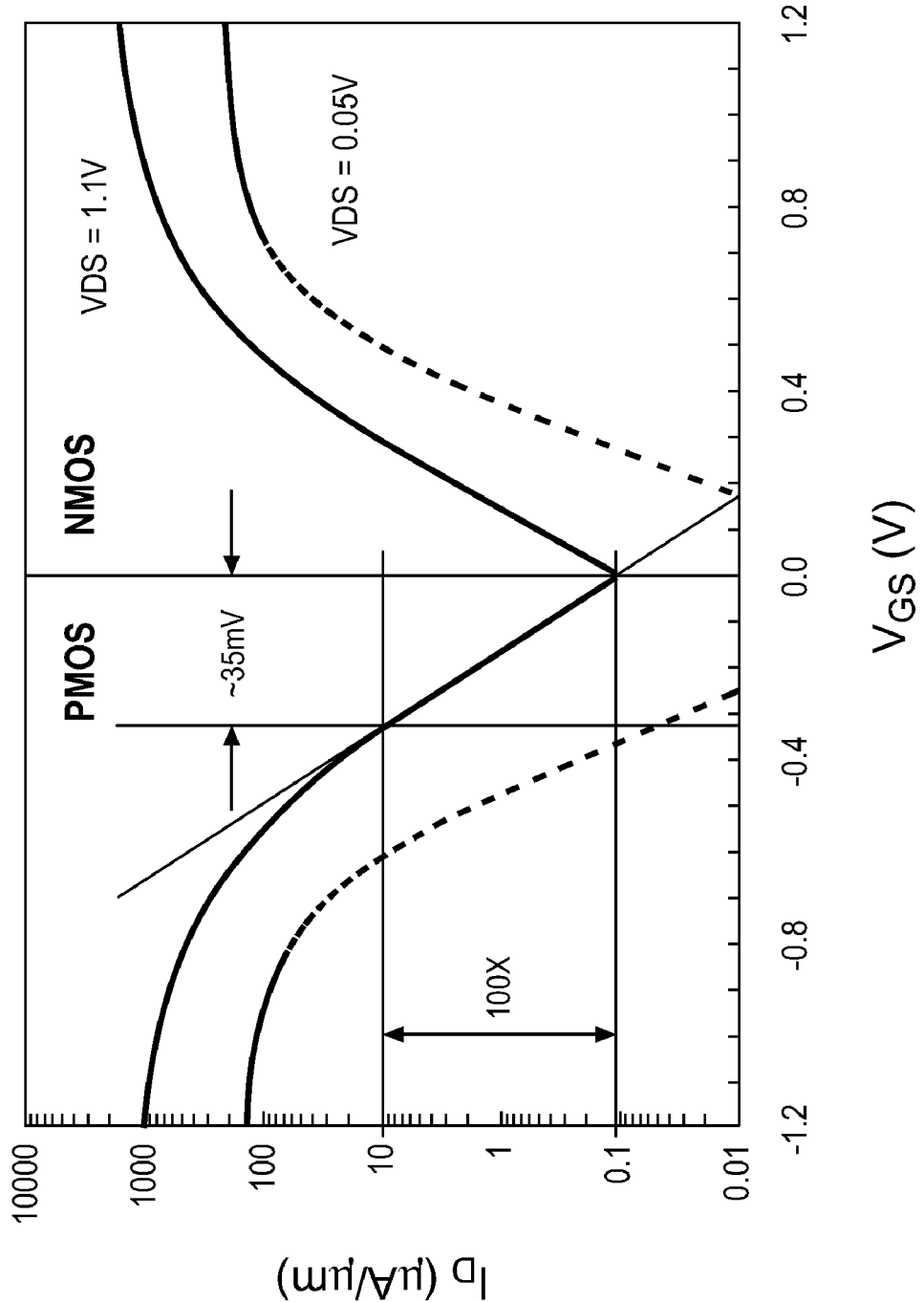
FIG. 10 is a plot showing that a significant reduction in the source-drain leakage current may be achieved by applying an overdrive voltage, according to one or more embodiments of the invention.

FIG. 10 is a plot showing that a significant reduction in the source-drain leakage current may be achieved by applying an overdrive voltage, according to one or more embodiments of the invention. The gate source voltage (VGS) is plotted on the x-axis against ID on the y-axis. Curves showing two different drain-source voltages (VDS) are shown. As shown, the off-state leakage of a PMOS transistor may be reduced by about one hundred fold by applying a gate overdrive of about 35 mV.

Figure 11:
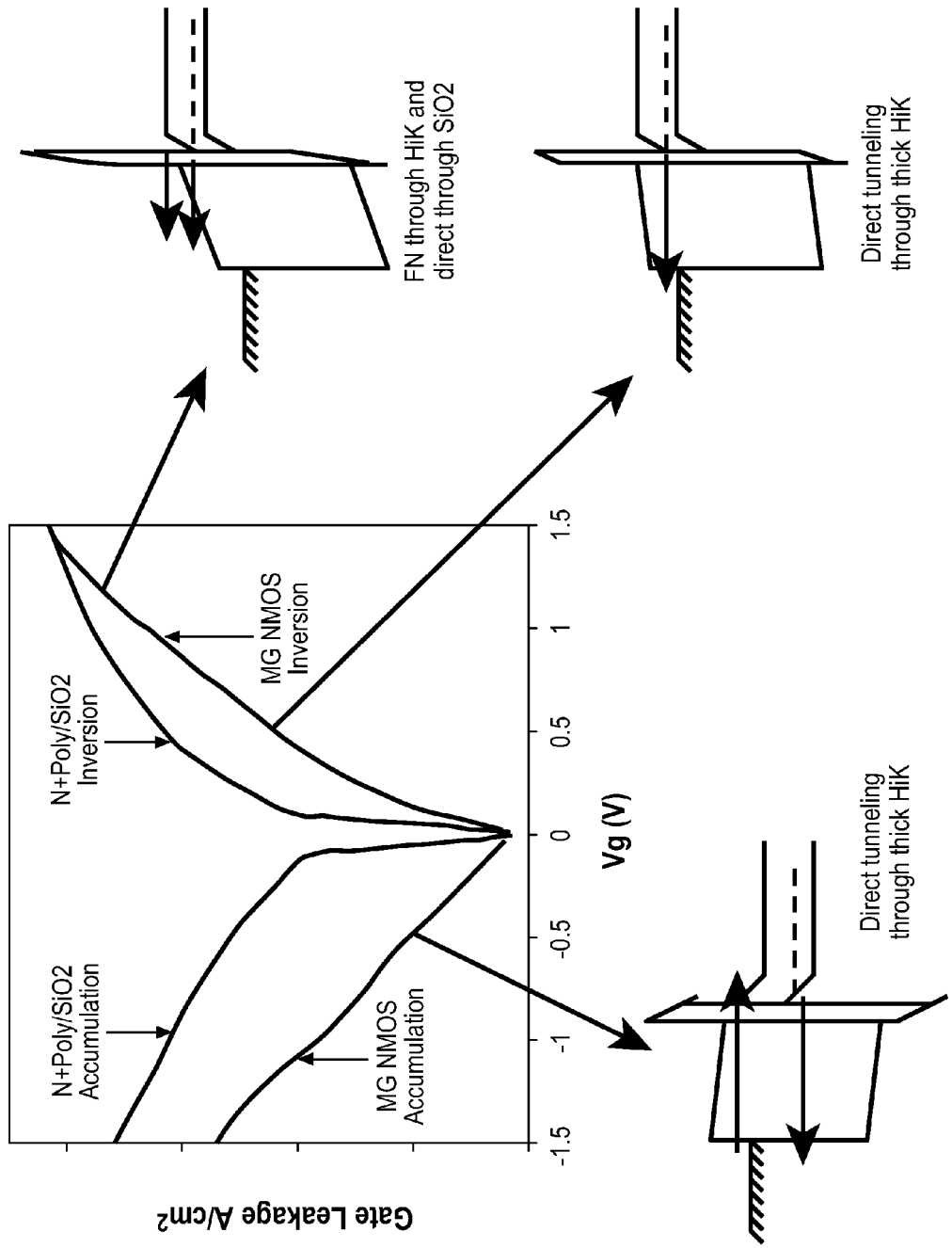
FIG. 11 is a plot showing gate leakage through an NMOS HiK transistor according to one aspect.

FIG. 11 is a plot showing gate leakage through an NMOS HiK metal gate transistor according to one aspect. Gate voltage (Vg) is plotted on the x-axis and the log of gate leakage current is plotted on the y-axis. The right side of the plot is inversion and the left side accumulation. HiK materials may be fabricated as a bilayers including a HiK gate dielectric material layer and an interface layer. If such a bilayer is fabricated in the form of an NMOS transistor, there may be two tunneling regimes. For low VGS (in inversion), the gate leakage of the device may be primarily through tunneling through the HiK region. However, for high VGS (in inversion) the gate leakage may be by Fowler-Nordheim (FN) tunneling through the thin interface oxide layer. Under these conditions of strong inversion (high VGS), the NMOS transistor with the HiK leaks almost as much or more than a conventional NMOS transistor with a silicon dioxide gate dielectric for high-drain bias inversion (see the cross-over region at the right side of the plot).

Figure 12:
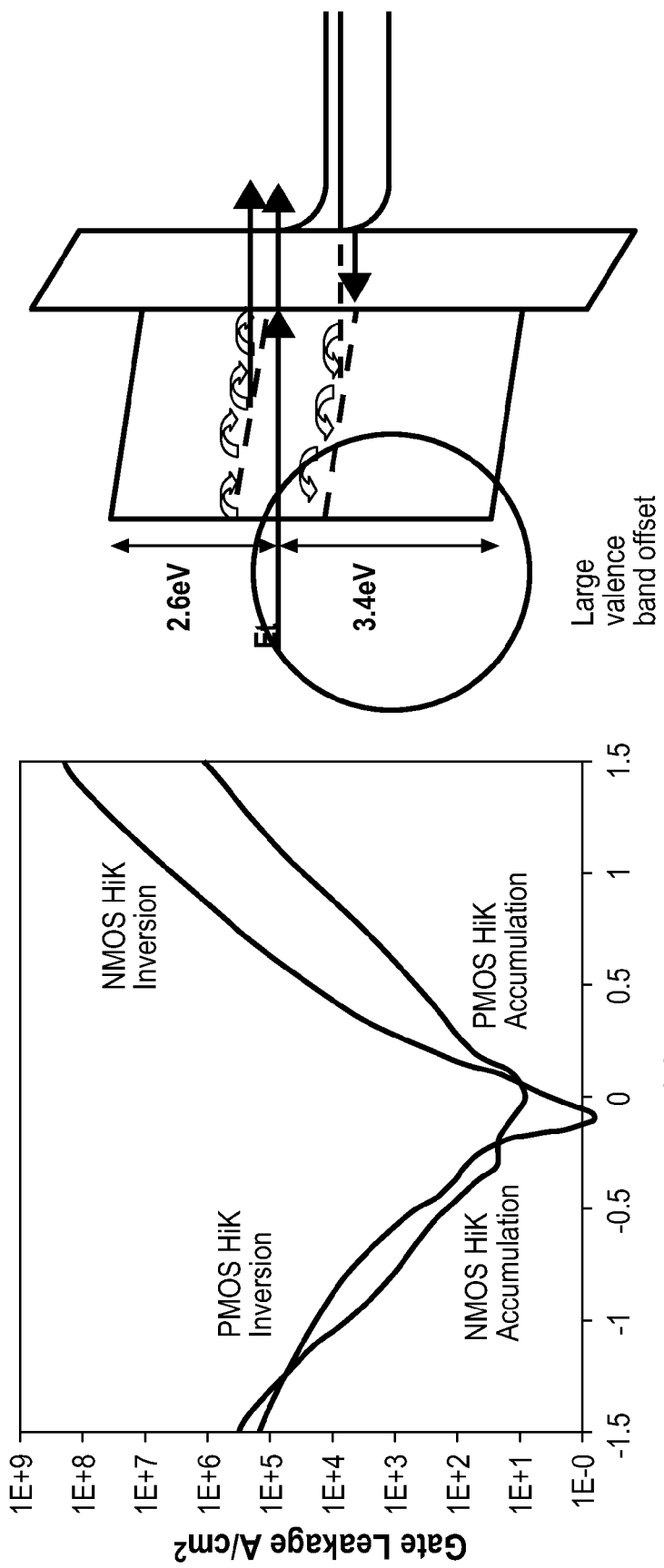
FIG. 12 is a plot comparing gate leakage for NMOS and PMOS HiK transistors, according to one or more embodiments of the invention.

FIG. 12 is a plot comparing gate leakage for an NMOS and PMOS HiK transistor, according to one or more embodiments of the invention. Gate voltage (Vg) is plotted on the x-axis and gate leakage is plotted on the y-axis. Because of the larger valence band offset, the PMOS device does not experience a similar increase in gate leakage in strong inversion (left side of the plot). Therefore, the PMOS transistor with the HiK gate dielectric leaks significantly less than the NMOS transistor due at least in part to a large valence band offset (compare the 2-3 order of magnitude reduction between the left and right sides of the plot).

Various approaches for providing electrical interconnection to and from the power switch unit will now be discussed. The approaches described below may offer certain potential advantages for a general-purpose processor in a computer system in which the electrical interconnection to and from the power switch unit may be sufficient to handle the peak current to the functional circuit and potentially fast current transitions (di/dt) that may potentially be encountered in the microelectronic device. In some general-purpose processors of computer systems, the peak current may be about 100 A, or higher, and the current transitions may be about 30 GA/s, or higher. Other approaches of interconnection are also suitable for general-purpose processors for computer systems. Furthermore, the scope of the invention is not limited to just general-purpose processors for computer systems. Other approaches of interconnection are suitable for other types of microelectronic devices and electronic devices in which they are employed.

In one or more embodiments of the invention, a power switch unit may be distributed throughout or otherwise included in a core or other functional circuit. This may help to reduce the number of die connection elements used to convey power. However, this may also tend to spread out the core, may tend to raise the core power, and/or may tend to lower the core speed. This may also potentially disrupt or alter the flow or design of the core. This may also tend to divert metal resources from signals to power.

Alternatively, in one or more embodiments of the invention, a power switch unit may be included outside of the core or other functional circuit. In one or more embodiments of the invention, die connection elements, such as, for example, C4 (Controlled Collapse Chip Connection) bumps, or the like, may be used as electrical conductors to provide power to, and in some embodiments from, the power switch unit. In one or more embodiments of the invention, a first set of C4 bumps may be used as input electrical conductors to provide electrical power to the power switch unit and a second set of C4 bumps may be used as output electrical conductors to provide electrical current from the power switch unit.

In one or more embodiments of the invention, underutilized or unutilized die connection elements, such as, for example, underutilized or unutilized C4 bumps, or the like, may be used to provide power to, and in some cases from, the power switch unit. As used herein, an unutilized die connection element may also be referred to herein as an underutilized die connection element. On some microelectronic devices, such as, for example, some general-purpose processors, there is an abundance of underutilized C4 bumps. The underutilized C4 bumps tend to be located over circuit portions of the microelectronic device that tend to use less power per unit area than other portions of the microelectronic device, such as, for example, the core(s). For example, on a microprocessor die the power density of the cache memory may be significantly less than the power density of the microprocessor core. Accordingly, in one or more embodiments, a portion of the underutilized C4 bumps over, or otherwise associated with, the cache memory area of the processor may be used to conduct unswitched current to the input of the power switch unit, and/or in some embodiments to conduct switched current from, the on-die power switch unit. In one or more embodiments of the invention, the transistors may be arrayed in 60 micron by 330 micron blocks in order to provide greater proximity to C4 bumps, although the scope of the invention is not limited in this respect.

According to one or more other embodiments, a first portion of the underutilized C4 bumps may be used to couple and provide unswitched current to the input of the power switch unit and a second portion of the underutilized C4 bumps may be used to couple and provide switched current from the output of the power switch unit back to the package for distribution to the core or other functional circuit. In such embodiments, one or more metal layers of the package may be used to distribute the switched current to the core or other functional circuit, instead of using the die metal to distribute the switched current.

Alternatively, in one or more embodiments of the invention, a thick on-die metal layer, such as, for example, having a thickness on the order of about 10 micrometers or more, may be used to move supply current laterally across the cache to the location of the power switch unit and to carry switched current from the output of the power switch unit to the processor core or other functional circuit. The thick on-die metal layer may also be used to laterally distribute cache current.

Figure 13A:
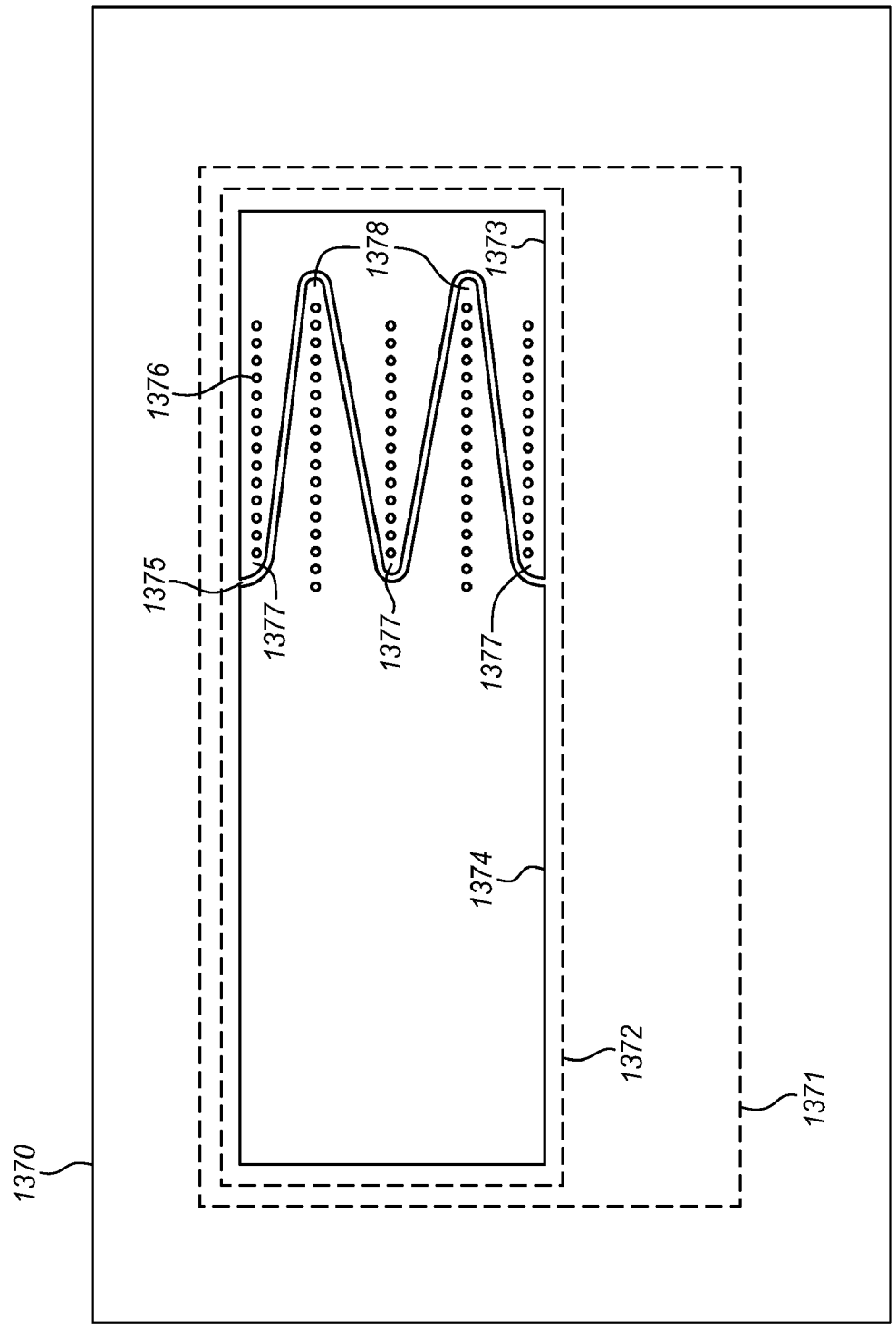
FIG. 13A shows a top plan view of an exemplary microelectronic device package substrate that may be used to support one or more on-die power switch units and shows supply conductors, according to one or more embodiments of the invention.
Figure 13B:
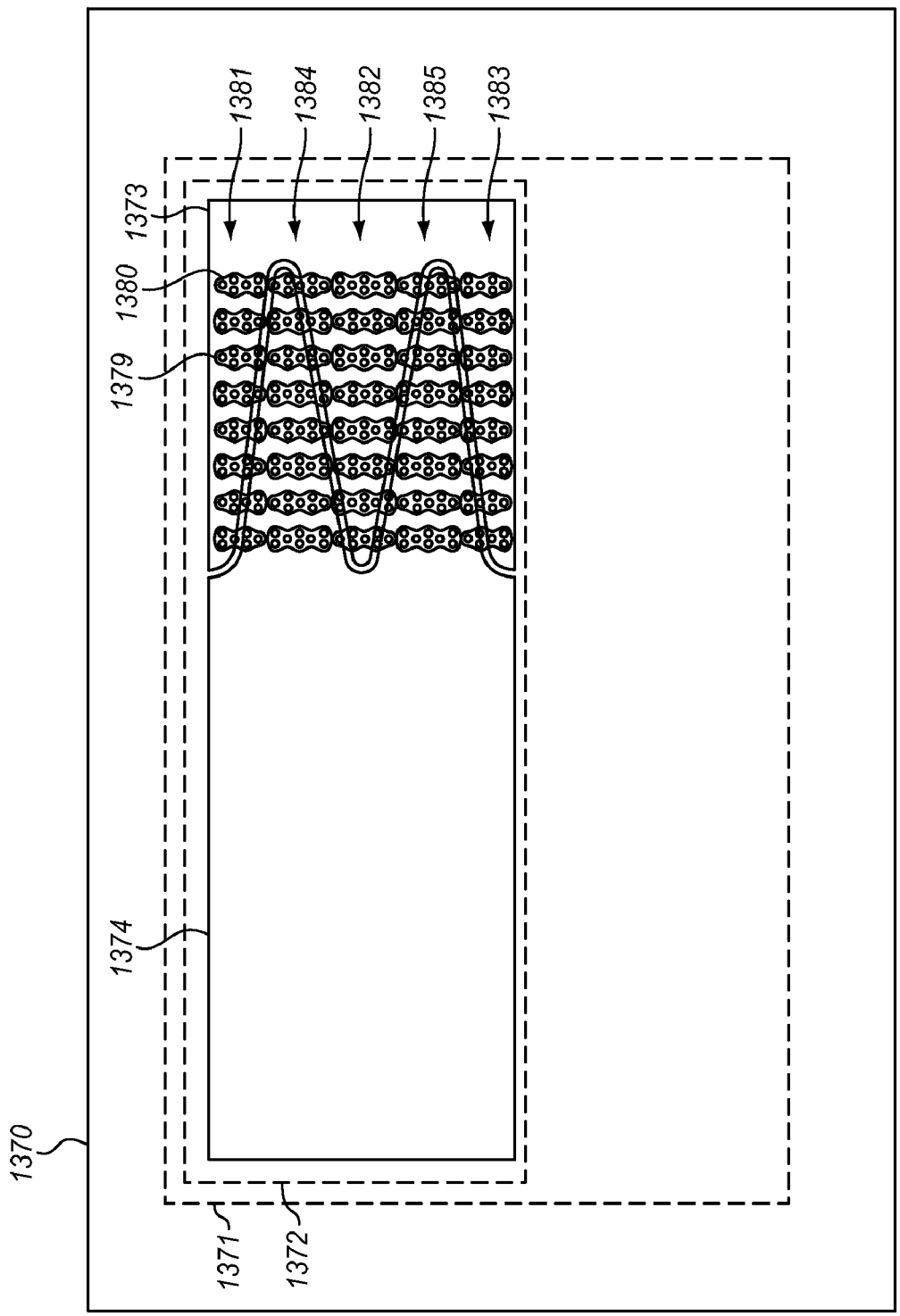
FIG. 13B shows a top plan view of an exemplary microelectronic device package substrate that may be used to support one or more on-die power switch units and shows an example top conductive layer of the package, according to one or more embodiments of the invention.

FIGS. 13A-B show an exemplary microelectronic device package substrate 1370 that may be used to support one or more on-die power switch units, according to one or more embodiments of the invention. The substrate may include supply conductors aligned with a core of a die. To avoid obscuring certain concepts, the actual die and core as well as certain package substrate details, such as, for example, additional signal conductors, ground conductors, and other power conductors, are not illustrated. For reference, the die and core outlines 1371, 1372 are indicated by dashed lines. A single core processor is illustrated for ease of explanation, although the scope of the invention is not limited to single core processors. Rather, one or more embodiments of the invention may be implemented in processors with more than one core, such as, for example, in dual core processors, including in package substrates having supply conductors aligned with each of the cores. The multiple cores may either be included on the same die or may be included on separate die on the same package. Other embodiments may be implemented in microelectronic devices other than microprocessors.

FIG. 13A is a top plan view showing supply conductors fabricated on or in an exemplary microelectronic device package substrate 1370, according to one or more embodiments of the invention. The package substrate includes unswitched supply conductors 1373. An on-die power switch unit, such as, for example, the power switch unit 230 shown in FIG. 2, may switchably interconnect unswitched supply from the unswitched supply conductors to an on-die functional circuit, such as, for example, the functional circuit 228 shown in FIG. 2, using thick on-die metal to distribute the switched supply to the functional circuit. The package substrate also includes switched supply conductors 1374 that are separated from the unswitched supply conductors by a gap 1375. The on-die power switch unit may switchably interconnect the supply from the unswitched supply conductor to the switched supply conductor.

The package substrate may include a multi-layer ceramic or organic structure with two or more layers of metals or other conductors separated by insulating layers. The unswitched and switched supply conductors may each include two or more conductive layers of the package substrate stacked and aligned to one another and interconnected using vias 1376. As shown, in one or more embodiments of the invention, the unswitched and switched supply conductors may optionally form interdigitated structures, although the scope of the invention is not limited in this respect. As illustrated, the unswitched and switched supply conductors may optionally include one or more fingers 1377, 1378 respectively. The scope of the invention is not limited to using any known number of fingers or to using interdigitaged structures.

In an embodiment of a multi-core microelectronic device the package substrate may optionally include switched and unswitched supply conductors aligned with or otherwise corresponding to each core. The on-die power switch units may switchably interconnect unswitched supply from the associated unswitched supply conductors to the associated on-die functional circuits, such as, for example, to the cores, or to the associated switched supply conductors.

FIG. 13B is a top plan view showing an example top conductive layer of the package substrate 1370, according to one or more embodiments of the invention. The top conductive layer includes a large plurality of C4 pads 1379. When a microelectronic device die is attached to the package substrate, the C4 bumps on the microelectronic device die are bonded to the C4 pads, such as, for example, by reflow soldering. In one embodiment, two or more C4 pads may be connected together or clustered and connected to the underlying unswitched or switched supply conductors. The C4 pad clusters 1380 may be formed from two or more C4 pads and may be arranged in rows. As illustrated, cluster rows 1381, 1382, and 1383 may be connected to the underlying unswitched supply conductor while cluster rows 1384 and 1385 may be connected to the underlying switched supply conductor. According to one or more embodiments, the C4 pad clusters and the fingers or other interdigitated structures may help to provide for a well-balanced current density and/or may help to reduce resistive losses, although they are not required. Furthermore, the scope of the invention is not limited to the amount or configuration of the C4 pad clusters illustrated.

Figure 14:
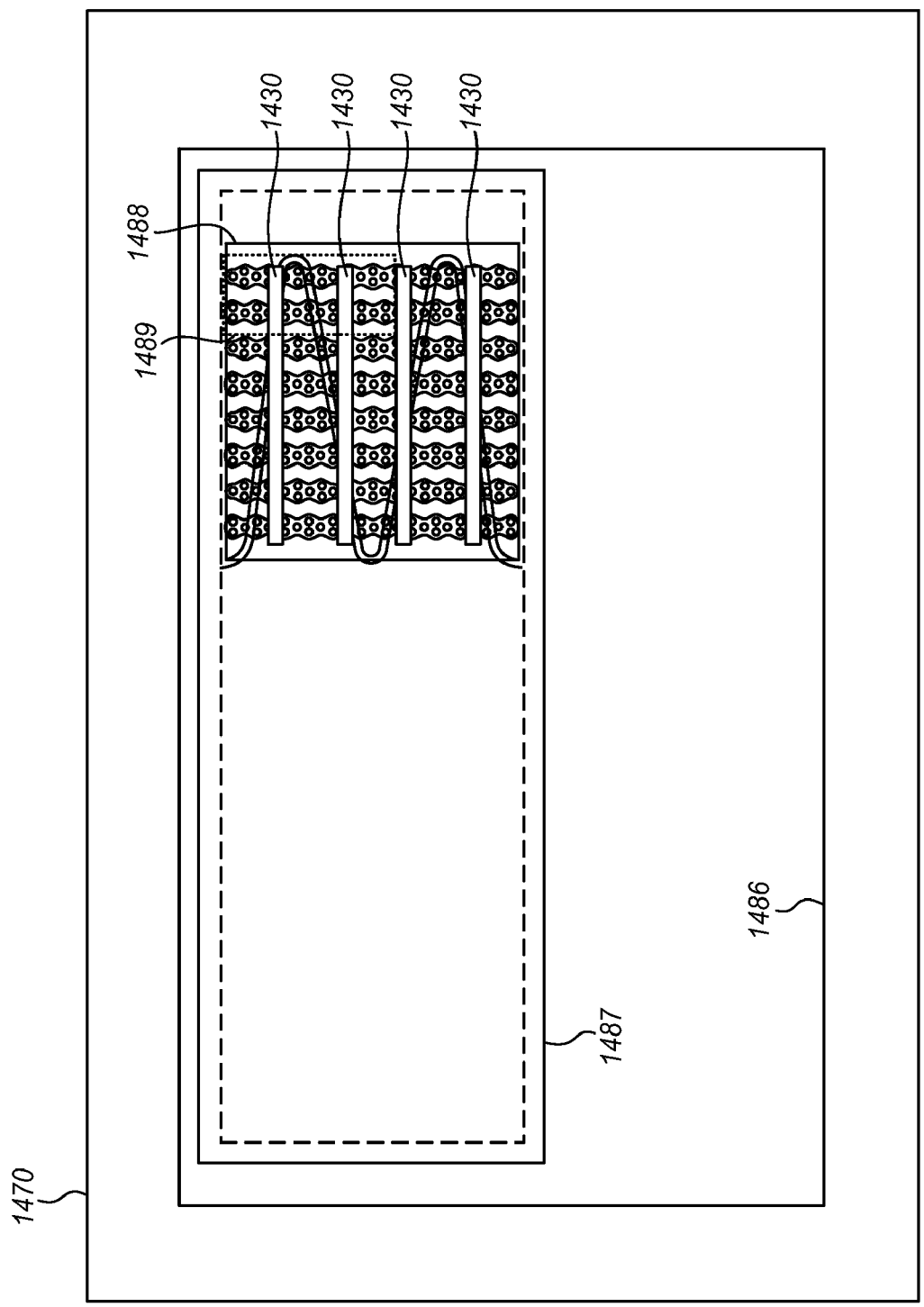
FIG. 14 shows a top plan view of a package having an exemplary microelectronic device die over a package substrate, according to one or more embodiments of the invention.

FIG. 14 is a top plan view showing an exemplary microelectronic device die 1486 over a package substrate 1470, according to one or more embodiments of the invention. In one or more embodiments of the invention the package substrate may be similar to the package substrate of FIGS. 13A-B. The microelectronic device die includes a portion 1487 that is aligned with the switched and unswitched supply conductors of the package substrate. The supply conductors are illustrated with dashed lines to indicate they are behind the portion 1487 and are not marked with reference numbers for visual ease. The C4 pad clusters and the cluster rows located on the top conductive layer of the package substrate are lightly illustrated for clarity and are also not marked with reference numbers for visual ease.

The portion 1487 may include a core of a microprocessor and may include cache memory 1488, such as, for example, to enhance the operating performance of the microprocessor. The cache memory may include one or more cache memory banks or arrays of memory cells (not illustrated). In one or more embodiments, a power switch unit may be included in the cache memory, such as, for example, embedded between banks of cache memory cells. As illustrated, four power switch units 1430 may be embedded between five banks of memory cells, although this is not required. The scope of the invention is not limited to any known number of power switch units, or banks of memory cells, or to any configuration of power switch units and banks of memory cells.

The one or more power switch units in the cache memory outside the core may handle the current from the core and may use thick on-die metal layers without diverting precious core metal resources from signals to power. Additionally, the cache memory may have underutilized C4 bumps that may be used to carry current to and, in some embodiments from, the one or more power switch units.

The cluster rows described with respect to FIG. 13B may optionally be aligned with the underutilized C4 bumps so that the core supply current may flow from an unswitched supply conductor to a power-gating circuit and the switched supply current to flow from the power gating circuit to the switched supply conductor where it may be distributed appropriately.

Figure 15:
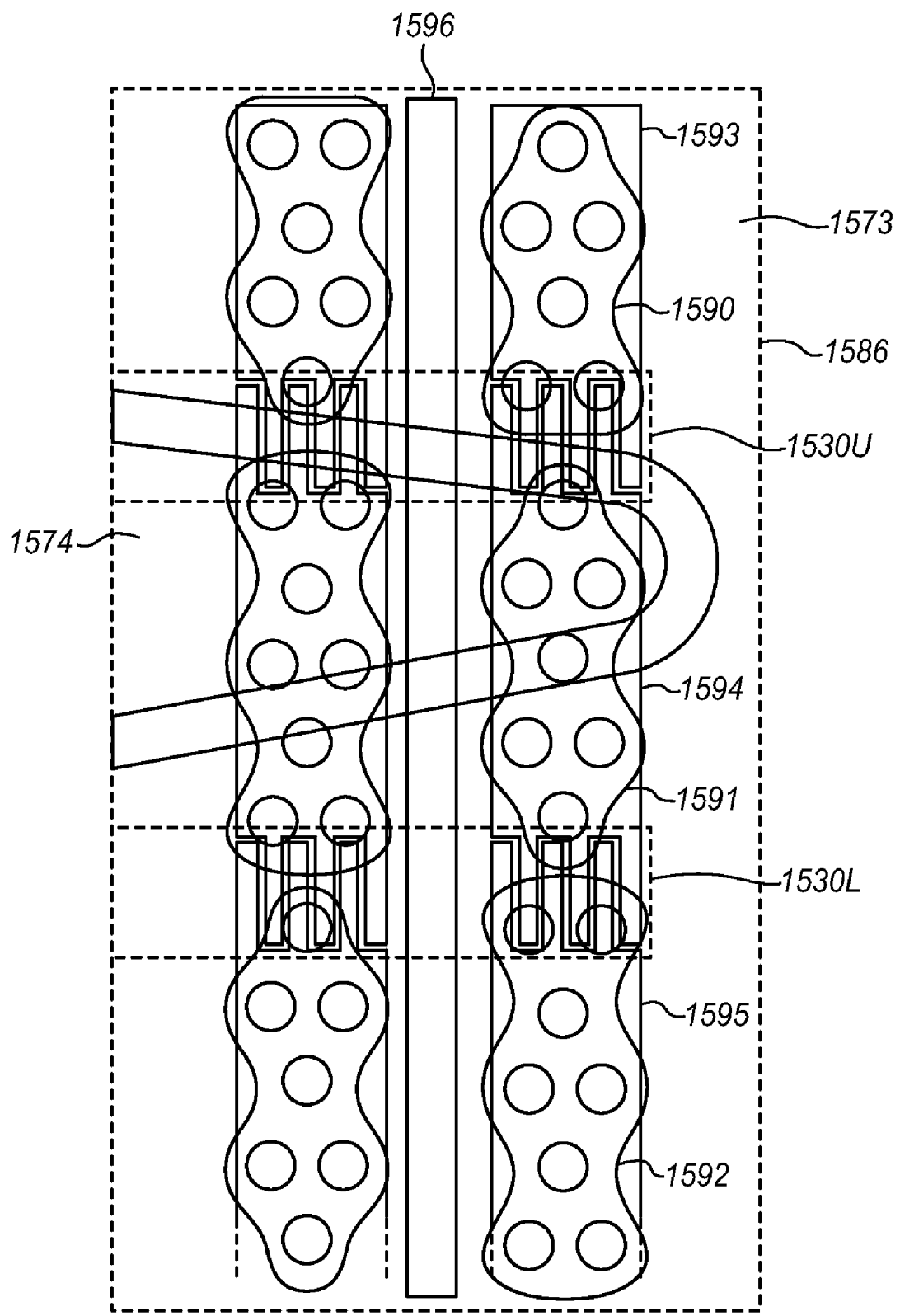
FIG. 15 shows a top plan view of a package having further details of the area illustrated in dotted outline in the upper right corner of FIG. 14, according to one or more embodiments of the invention.

FIG. 15 is a top plan view showing further details of the area illustrated in dotted outline 1489 in the upper right corner of FIG. 14, according to one or more embodiments of the invention. It should be noted that terms such as "top", "bottom", "upper", "lower", "vertical", "horizontal", and the like, are used herein only to facilitate the description of the structure as illustrated. It is to be appreciated that the microelectronic devices may be used in a variety of orientations.

A portion of a microelectronic device die 1586 on a package substrate is shown. As with FIG. 14 the C4 pad clusters located on the top conductive layer of the package substrate are lightly illustrated to indicate they are below the die. The top conductive layer includes an unswitched supply conductor 1573 and a switched supply conductor 1574 and three rows of pad clusters, including a top row 1590, a middle row 1591, and a bottom row 1592. The top row of pad clusters and the bottom row of pad clusters are connected to the unswitched supply conductor, and the middle row of pad clusters is connected to the switched supply conductor. The die includes two power switch units including an upper power switch unit 1530U and a lower power switch unit 1530L, and four thick on-die metal areas 1593, 1594, 1595, 1596 used to carry current. The thick on-die metal areas 1593, 1594, and 1595 may be used to spread the current into and out of the power-gating circuits to balance the current flow through individual C4 bumps to reduce or eliminate the occurrence of electromigration. The thick on-die metal areas 1593, 1594, and 1595 may be interdigitated with one-another over the power-gating circuits to improve current distribution to the power-gating circuitry.

The first thick on-die metal area 1593 may be used to carry current across the cache memory area from the unswitched supply conductor 1573 (the first cluster of C4 bumps 1590) to the upper power-gating circuitry 1530U. The second thick on-die metal area 1594 may be used to carry current from the upper and lower power-gating circuits to the switched supply conductor 1574 (the second cluster of C4 bumps 1591). The third thick on-die metal area 1595 may be used to carry current from the unswitched supply conductor 1573 (the third cluster of C4 bumps 1592) to the lower power switch unit 1530L.

The on-die thick metal area 1596 may be used to route power for the on-die circuitry, such as, for example, the cache memory, underlying the C4 bumps used to convey power to and from the upper and lower power switch units. The on-die thick metal area 1596 may route switched supply current as power to the underlying circuitry (not illustrated) from the upper and lower power switch units, the unswitched supply conductor, or a power supply separate from the core power supply.

In the description above, for the purposes of explanation, numerous specific details have been set forth in order to provide a thorough understanding of the embodiments of the invention. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known circuits, structures, and devices have been shown in block diagram form or without detail in order to avoid obscuring the understanding of the description.

It will be appreciated that for simplicity and clarity of illustration, elements illustrated in the figures have not necessarily been drawn to scale. For example, the dimensions of some of the elements may have been exaggerated relative to other elements for ease of illustration and/or clarity. Furthermore, it will also be appreciated, by one skilled in the art, that modifications may be made to the embodiments disclosed herein, such as, for example, to the sizes, configurations, functions, materials, and manner of operation of the components of the embodiments. All equivalent relationships to those illustrated in the drawings and described in the specification are encompassed within embodiments of the invention. Where considered appropriate, reference numerals may have been repeated among the figures to indicate corresponding or analogous elements.

Various operations and methods have been described. Some of the methods have been described in a basic form, but operations may optionally be added to and/or removed from the methods. The operations of the methods may also often optionally be performed in different order. Many modifications and adaptations may be made to the methods and are contemplated.

In the description and claims, the terms "coupled" and "connected," along with their derivatives, may have been used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

For clarity, in the claims, any element that does not explicitly state "means for" performing a specified function, or "step for" performing a specified function, is not to be interpreted as a "means" or "step" clause as specified in 35 U.S.C. Section 112, Paragraph 6. In particular, any potential use of "step of" in the claims herein is not intended to invoke the provisions of 35 U.S.C. Section 112, Paragraph 6.

It should also be appreciated that reference throughout this specification to "one embodiment", "an embodiment", or "one or more embodiments", for example, means that a particular feature may be included in the practice of the invention. Similarly, it should be appreciated that in the description various features are sometimes grouped together in a single embodiment, Figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

Accordingly, while the invention has been thoroughly described in terms of several embodiments, those skilled in the art will recognize that the invention is not limited to the particular embodiments described, but may be practiced with modification and alteration within the spirit and scope of the appended claims. The description is thus to be regarded as illustrative instead of limiting.

What is claimed is:

1. An apparatus comprising:
a cache memory;
a functional circuit of a microprocessor having multiple cores; and
a power switch unit to switch power to the functional circuit of the microprocessor having multiple cores on and off, the power switch unit including a large number of transistors including at least 100 transistors coupled together in parallel, the at least 100 transistors comprising predominantly positive-channel, insulated gate field effect transistors, which have a gate dielectric that includes a high dielectric constant material,
wherein at least a portion of the power switch unit is included in the cache memory, and
wherein bumps associated with the cache memory are used to conduct unswitched current to the power switch unit.

2. The apparatus of claim 1, wherein the high dielectric constant material has a higher dielectric constant than silicon dioxide and has a greater valence band offset than conduction band offset.

3. The apparatus of claim 2, wherein the high dielectric constant material is selected from the group consisting of oxides of hafnium, oxides of tantalum, compounds including barium plus oxides of titanium, compounds including barium plus oxides of zirconium, oxides of zirconium, oxides of aluminum, oxides of yttrium, compounds including zirconium plus oxides of silicon, and combinations thereof.

4. The apparatus of claim 3, wherein the high dielectric constant material is selected from the group consisting of hafnium dioxide ($HfO_2$), tantalum pentoxide ($Ta_2O_5$), barium titanate ($BaTiO_3$), barium zirconate ($BaZrO_3$), zirconium dioxide ($ZrO_2$), aluminum oxide ($Al_2O_3$), yttrium oxide ($Y_2O_3$), zircon ($ZrSiO_4$), and combinations thereof.

5. The apparatus of claim 4, wherein the high dielectric constant material comprises hafnium dioxide ($HfO_2$).

6. The apparatus of claim 1, wherein gates of the transistors are coupled to have a voltage that is greater than a voltage at sources of the transistors.

7. The apparatus of claim 6, wherein the voltage at the gates minus the voltage at the sources is from 0.01V to about 1V.

8. The apparatus of claim 6, wherein the voltage at the gates minus the voltage at the sources is from 0.1V to about 0.5V.

9. The apparatus of claim 6, wherein the voltage at the gates minus the voltage at the sources is from 0.2V to about 0.4V.

10. The apparatus of claim 1, wherein the functional circuit comprises a core of the microprocessor.

11. A system comprising:
a bus;
a dynamic random access memory (DRAM) coupled with the bus; and
an microelectronic device coupled with the bus, the microelectronic device including multiple cores and comprising:
a cache;
a functional circuit; and
a power gate circuit to gate power to the functional circuit, the power gate circuit including at least 100 transistors coupled together, a majority of the transistors being positive-channel, insulated gate field effect transistors that have a gate insulator that includes a high dielectric constant material, wherein at least a portion of the power gate circuit is included in the cache, and wherein bumps associated with the cache are used to conduct unswitched current to the power gate circuit.

12. The system of claim 11, wherein the high dielectric constant material has a greater valence band offset than conduction band offset.

13. The system of claim 11, wherein the high dielectric constant material is selected from the group consisting of hafnium dioxide ($HfO_2$), tantalum pentoxide ($Ta_2O_5$), barium titanate ($BaTiO_3$), barium zirconate ($BaZrO_3$), zirconium dioxide ($ZrO_2$), aluminum oxide ($Al_2O_3$), yttrium oxide ($Y_2O_3$), zircon ($ZrSiO_4$), and combinations thereof.

14. The system of claim 11, wherein, when the power gate circuit is off, gates of the transistors are to have a greater voltage than a voltage at sources of the transistors by at least 0.1V.

15. The system of claim 11, wherein the functional circuit comprises a core.

* * * * *